United States Patent [19]

Hazama et al.

[11] Patent Number: 5,191,374
[45] Date of Patent: Mar. 2, 1993

[54] EXPOSURE CONTROL APPARATUS

[75] Inventors: Junji Hazama, Yokohama; Kazuaki Suzuki; Tsunesaburo Uemura, both of Tokyo, Japan

[73] Assignee: Nikon Corporation, Tokyo, Japan

[21] Appl. No.: 799,777

[22] Filed: Nov. 27, 1991

Related U.S. Application Data

[63] Continuation of Ser. No. 623,176, Dec. 5, 1990, abandoned, which is a continuation-in-part of Ser. No. 438,091, Nov. 16, 1989, abandoned.

[30] Foreign Application Priority Data

Nov. 17, 1988 [JP] Japan .................................. 63-288977
Dec. 7, 1989 [JP] Japan .................................. 1-318245

[51] Int. Cl.⁵ .............................................. G03B 27/52
[52] U.S. Cl. ............................................ 355/43; 355/53
[58] Field of Search .......................... 355/43, 45, 53, 54, 355/69, 71, 77, 68; 356/400, 401, 35 L; 353/38, 122; 362/268

[56] References Cited

U.S. PATENT DOCUMENTS 4,970,546 11/1990 Suzuki et al. .......................... 355/53

Primary Examiner—Michael L. Gellner
Assistant Examiner—D. Rutledge
Attorney, Agent, or Firm—Michael N. Meller

[57] ABSTRACT

An exposure control apparatus for controlling exposure quantity of pulse energy to a resist, when pattern of a rectile is transcribed to the resist on a wafer, using pulse energy accompanied by energy variation within a predetermined range per each emission, i.e., coherent or non-coherent light energy, or pulse energy other than light, such as X-ray. The exposure control apparatus comprises arithmetic means for calculating the pulse number necessary for the exposure based on range of energy variation between emission pulse energies of each time and the allowable control accuracy predetermined for the aimed proper exposure quantity, and for estimating the object value corresponding to the object integrated energy quantity to be supplied to the resist every time each pulse energy of the necessary pulse number is illuminated based on the predetermined value in response to the pulse number and the proper exposure quantity; an energy quantity measuring apparatus for detecting the measured value corresponding to the actual integrated energy quantity obtained by the pulse energy previously illuminated; and an energy quantity adjusting apparatus for adjusting the energy quantity of next pulse energy corresponding to the difference between the object value to be attained in response to the illumination of next pulse energy and the measured value until then.

20 Claims, 8 Drawing Sheets

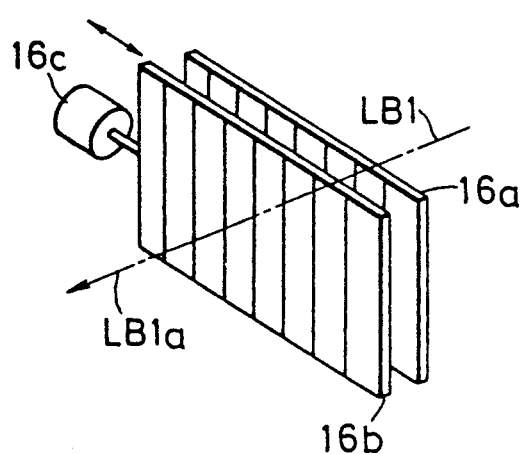
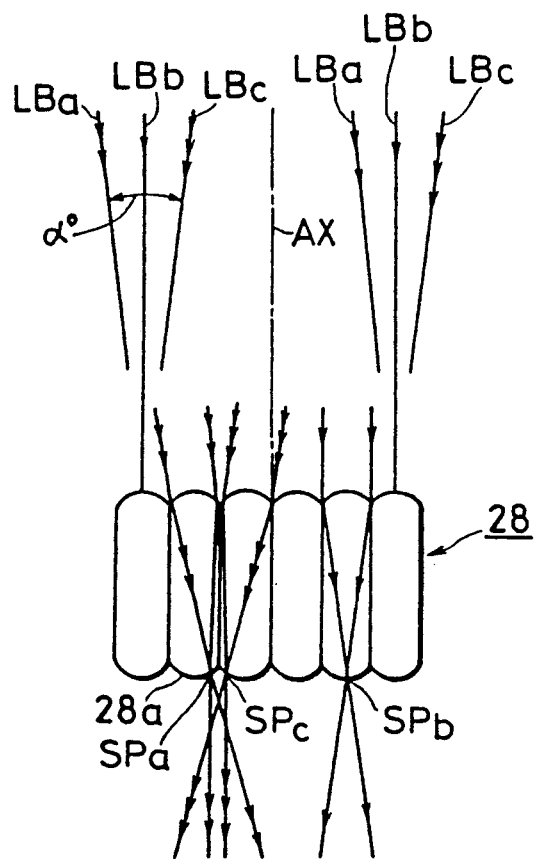
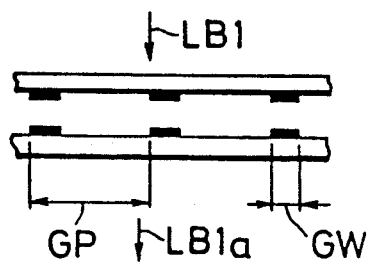
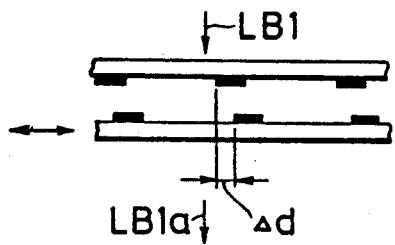
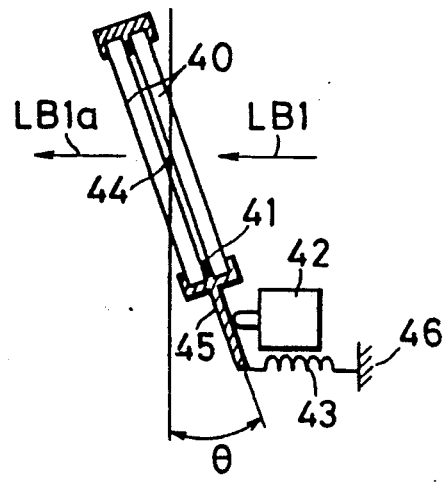

FIG.6
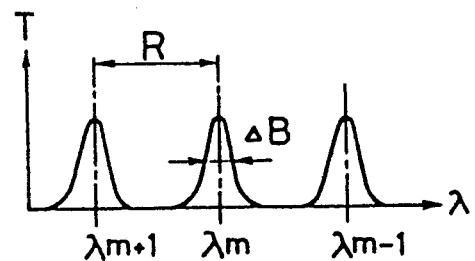
FIG.7(a)
FIG.7(b)
FIG.7(c)
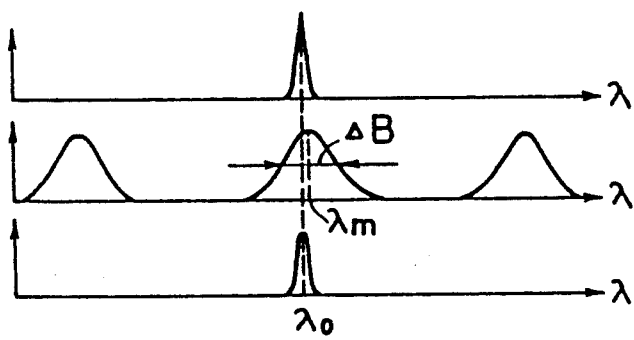
FIG.8
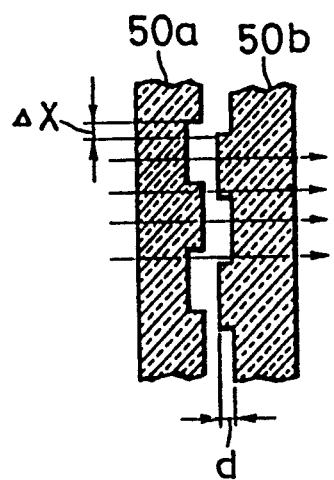

EXPOSURE CONTROL APPARATUS

This application is a continuation of application Ser. No. 623,176, filed Dec. 5, 1990, now abandoned, which is a continuation in part of Ser. No. 438,091 filed Nov. 16, 1989, now abandoned.

BACKGROUND OF THE INVENTION

1. Field of the Invention

The present invention relates to an apparatus for controlling exposure quantity in the photolithography process to manufacture semiconductor devices. More specifically the invention relates to an apparatus for controlling the illumination energy quantity to a suitable sensitive substrate, for example, in an exposure apparatus using a pulse laser such as an eximer laser as exposure light, and to an exposure apparatus provided with such an exposure control apparatus.

2. Description of the Prior Art

In the prior art, since laser light generally has a variation of intensity of about ±10% between pulse and a phenomenon of lower laser output density exists for a short period or for a long period, control of exposure quantity in an exposure apparatus using a pulse laser as a light source has been performed in a manner that light quantity in each pulse is detected and integrated and the laser emission is performed until the integration result becomes a desired value.

In general, lower phenomenon of the laser output density is conspicuous in the case of using a gas laser, because deterioration of laser gas within a laser chamber is accompanied by the lowering of the laser output. It is usual that, when the inner gas has deteriorated in a gas laser and the laser output is lowered, the discharge applied voltage of the device or the like is adjusted and the discharge energy is increased, or in some cases the inner gas is partially exchanged by a fresh laser gas and the lowering of the laser output is reduced. However, the control of the desired exposure quantity with fixed pulse number is difficult.

Under these circumstances, a control apparatus requiring the exposure quantity control with a higher accuracy such as in exposure control in an exposure apparatus for manufacturing semiconductor devices is disclosed in Japanese patent application laid-open No. SHO-60-169136.

In this apparatus, the exposure energy to be supplied to a sensitive substrate (such as wafer with resist) is divided into two stages, pre-exposure giving the exposure energy slightly less than the proper exposure quantity and revisional exposure giving the residual exposure energy required. Thereby variation of the exposure energy as a whole is controlled. When exposure of one shot is performed by plural pulses, the exposure quantity is controlled by the final pulse with the energy quantity less than that of the other pulse, thereby the optimum exposure quantity can be obtained. In this connection, one shot means that the exposure energy is illuminated through a mask to the whole wafer in the case of a lump exposure system, and that the exposure energy is illuminated to one partial region on the wafer in the case of step-and-repeat system (described later).

In step-and-repeat system adopted in the exposure apparatus for manufacturing semiconductor devices in recent years, in order to expose one wafer, the region to be exposed is divided into a plurality of exposure regions and the exposure is performed in each exposure region. When the exposure in one exposure region is finished the exposure is moved to next exposure region and performed again, and this operation is repeated thereby the exposure of the whole surface of the wafer is finally performed.

Consequently, in order to increase the production amount of the semiconductor devices per unit time, it is important that the moving time between the exposure regions is made as short as possible and the exposure time in each exposure region is made as short as possible. Therefore, even when the exposure is performed by means disclosed in Japanese patent application No. SHO-60-169136, it is necessary that the pre-exposure is performed by energy as large as possible and the time of the revisional exposure is made short.

In the method disclosed in the Japanese patent application laid-open No. SHO-60-169136, however, since feedback control does not exist for error (variation) of the energy quantity contained in the final pulse, a disadvantage exists in that the exposure quantity is not controlled properly and the suitable exposure cannot be performed.

Since the setting energy of the final pulse becomes the value of the proper exposure quantity subtracted by the pre-exposure quantity, problem exists in that the dynamic range of means for setting the exposure quantity of the final pulse must be made large, thereby the apparatus is complicated and high control accuracy cannot be obtained.

Japanese patent application laid-open No. SHO-63-81862 discloses a method of obtaining the proper exposure quantity using the revisional exposure as plural pulses. However, also in this case, the problem is not eliminated that the exposure time becomes long and the dynamic range of the exposure quantity setting means becomes large.

Further in a method of adjusting the exposure quantity by the revisional exposure as above described, since the energy quantity of one pulse and the exposure pulse number during the revisional exposure are dependent on the integrated exposure quantity when the pre-exposure is finished, a variation exists in that these values do not become constant in each shot. That is, when the exposure energy source is a laser light source, unevenness of intensity of illumination called speckle may be produced in the exposure surface due to coherency of the laser light, and the above-mentioned light quantity control method cannot reduce this speckle effectively. This problem will be described as follows.

Since the speckle has a serious influence on the control of the pattern line width in the photolithography process during manufacturing the semiconductor devices, as taught in U.S. Pat. No. 4,619,508 for example, the speckle pattern (or interference pattern) may be moved at the emission of each pulse (the laser light may be oscillated) thereby the speckle may be smoothed. However, in order that method in U.S. Pat. No. 4,619,508 and method in Japanese patent application laid-open No. SHO-63-81882 are combined and both the optimization of the exposure quantity and the reduction of the speckle are performed, as disclosed in U.S. Pat. No. 4,619,508, the light source image (laser spot) on the pupil plane of the projection lens must be distributed as uniformly as possible within the pupil plane. In order to realize this, it is necessary that the point number of the laser spots in the pupil surface be made constant and the exposure if performed at the pattern number of integer times of the point number of the laser spots and the laser intensity is held constant during the exposure. However, in the method of Japanese patent application laid-open No. SHO-63-81882 as above described, only the region corresponding to the revisional exposure state has lower integrated energy than that of other region, and as a result the speckle cannot be reduced sufficiently.

SUMMARY OF THE INVENTION

The main object of the invention is to provide an exposure control apparatus wherein the exposure quantity can be controlled with the required accuracy in the wide dynamic range without lengthening the exposure time.

Another object of the invention is to provide the exposure control apparatus wherein the intensity of illumination can be unified further effectively.

According to one form of the invention, when pulse energy accompanied by energy variation within a predetermined range pr each emission is illuminated plural times to the first body through the second body, and a pattern formed on the second body is transcribed to the first body sensitive to the pulse energy by the plural times of the illumination of the pulse energy, an exposure control apparatus for controlling the exposure quality of the pulse energy to the first body is provided. In order to attain the foregoing objects, the exposure control apparatus comprises:

an arithmetic means for estimating the pulse number necessary for the exposure based on the range of energy variation between emission pulse energies of each time and the allowable control accuracy predetermined for the aimed proper exposure quantity, and for estimating the object value corresponding to the object integrated energy quantity to be supplied to the first body every time each pulse energy of the pulse number is illuminated based on the predetermined value in response to the pulse number and the proper exposure quantity;

energy quantity measuring means for detecting the measured value corresponding to the actual integrated energy quantity obtained by the pulse energy previously illuminated; and energy quantity adjusting means for adjusting the energy quantity of next pulse energy corresponding to the difference between the object value to be attained in response to the illumination of next pulse energy and the measured value measured until then.

According to another form of the invention, when the coherent pulse a light accompanied by light quantity variation within a predetermined range per each emission is illuminated plural times to the first body through the second body, and an interference pattern formed on the first body or the second body by the illumination of the pulse light is displaced per the illumination of the pulse light of each time and required smoothing of the intensity of illumination is performed. The pattern formed on the second body by the plural times of illumination of the pulse light is transmitted to the first body sensitive to light. An exposure control apparatus for controlling the exposure quantity of the pulse light illumination to the first body is provided. In order to attain the foregoing objects, the exposure control apparatus comprises:

a first arithmetic means for predetermining the average light quantity value of each pulse light with the pulse number based on the pulse number necessary for the required smoothing of the intensity of illumination and the predetermined value in response to the aimed proper exposure quantity;

a second arithmetic means for determining the object value corresponding to the object integrated light quantity to be supplied to the first body per each pulse with the pulse number when the pulse light is illuminated under the average light quantity value;

a light quantity measuring means for detecting the measured value corresponding to the actual integrated energy quantity supplied to the first body;

a third arithmetic means for calculating the difference between the measured value obtained by the pulse light previously illuminated and the object value requiring; and a light quantity adjusting means for adjusting the light quantity of the pulse light to be illuminated next so that it is corrected from the average light quantity value by a value corresponding to the calculated difference.

In the invention, since the exposure energy is controlled so that it becomes the predetermined average value throughout all pulses to be exposed, and the pulse number per each shot is made nearly constant, even if a coherent pulse is used, the speckle pattern on the exposure surface is moved in synchronization with the illumination of the pulse light, thereby the speckle pattern at the final state can be smoothed substantially completely.

Since the correction of exposure by lowering the energy quantity of the last several pulses or one pulse as in the prior art is not performed, the exposure time in each shot can become shorter and constant.

Since the illumination energy quantity is measured in each pulse and adjusted in each pulse, in comparison to the prior art where the illumination energy quantity is adjusted at the stage being considerably close to the object exposure quantity, the dynamic range of the measuring means for measuring the illumination energy quantity and the adjusting means for adjusting the illumination energy quantity of next pulse may be small and the control accuracy of the exposure quantity can be improved.

Since the pulse number illuminated during the exposure of one short becomes the preset constant value and the exposure quantity control is performed in each pulse, the apparatus of the instant invention is an improvement because the interference pattern is moved in each pulse and smoothed. Since the exposure is performed with minimum number of pulses, the productivity can be improved. Since the exposure quantity control is performed per one pulse, the exposure energy quantity (light quantity) can be controlled more accurately than with the prior art.

The foregoing and other objects and advantages of the present invention can be more clearly understood from the following description of the embodiments referring to the accompanying drawings.

BRIEF DESCRIPTION OF THE DRAWINGS

FIG. 2 is a diagram of an example of a fast optical attenuator;

FIGS. 3a and 3b are explanations diagrams of the attenuation operation of the fast optical attenuator in FIG. 2;

FIG. 4 is a diagram illustrating the typical relationship between a fly-eye lens as an optical integrator and the incident beam;

FIG. 5 is a structural diagram of another example of a fast optical attenuator;

FIGS. 6 and 7A, 7B, 7C are explanatory diagrams of the operation of the fast optical attenuator in FIG. 5;

FIG. 8 is a diagram of still another example of a fast optical attenuator;

DESCRIPTION OF THE PREFERRED EMBODIMENTS

Figure 1:
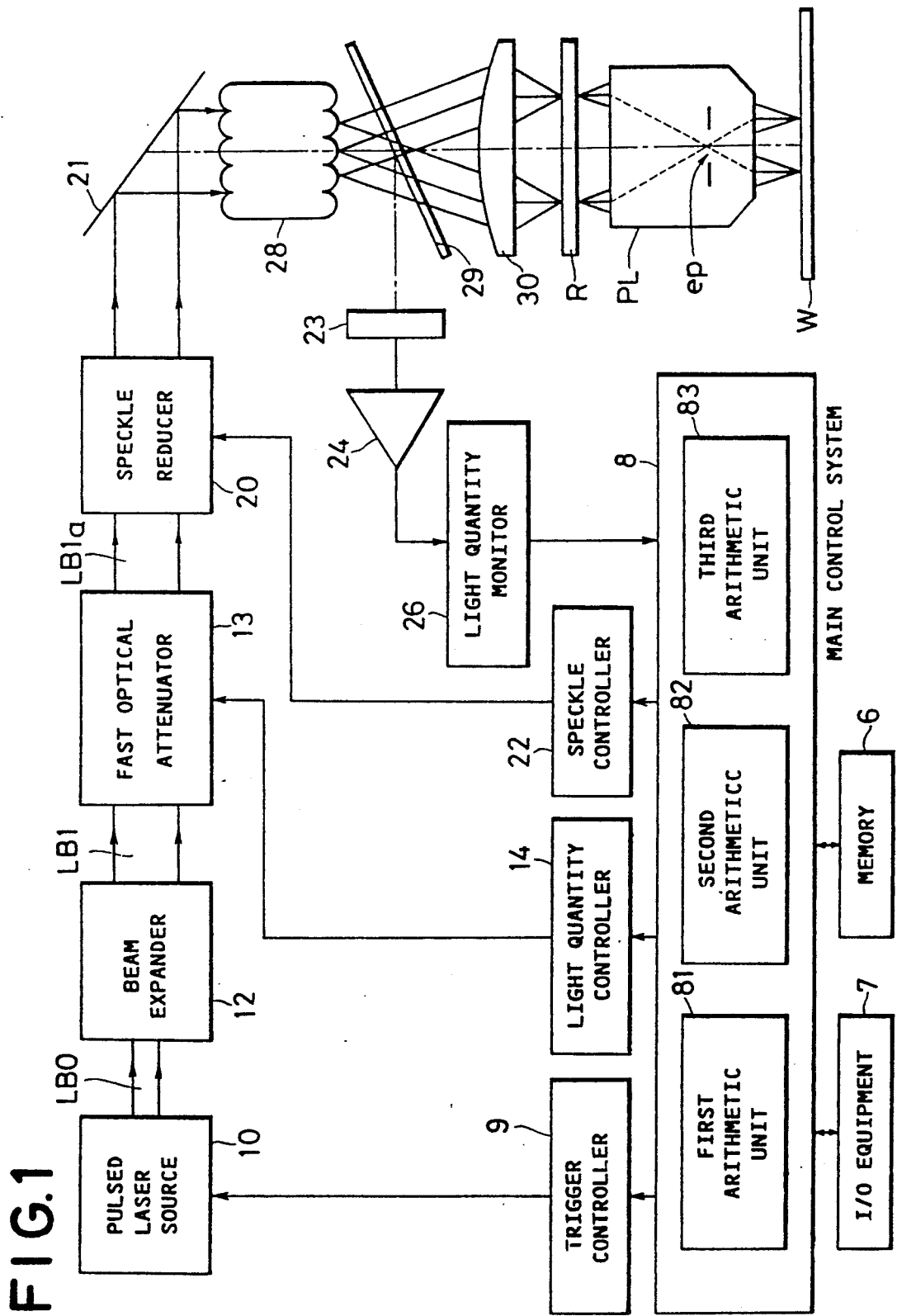
FIG. 1 is a diagram illustrating a schematic block design of an exposure control apparatus as an embodiment of the invention applied to a reduction projection type exposure apparatus.

FIG. 1 shows an embodiment of the present invention, where an exposure control apparatus of the invention is applied to a reduction projection type exposure apparatus (stepper) for transcribing a pattern the to manufacture of semiconductor devices formed on a reticle R (second body) onto a wafer W (first body) with a surface coated by a resist through a projection lens PL.

In FIG. 1, a pulse laser source 10 for emitting pulse light such as an eximer laser light has its oscillation controlled by external trigger pulses supplied from a trigger controller 9. The pulsed laser source 10 as known well, comprises a laser tube having a sealed laser chamber, a pair of resonance mirrors arranged on both ends of the laser tube, and a narrow band wavelength stabilizing arrangement comprising an etalon or a light dispersion element and inserted in a part of a laser resonating path between the pair of resonance mirrors, and is combined as a laser source having a stabilized resonator. Emitted beam LB0 from the pulsed laser beam 10 has a deep UV band of wavelength 248 nm for example, and its beam section is of rectangular form with length/-width ratio of about ½–1/5. The laser beam LB0 is incident to a beam expander 12 in combination of a plurality with cylindrical lenses, and the expander 12 shapes the beam section from a rectangular form into nearly a square form and emits the shaped beam as beam LB1. The a beam LB1 having a beam section of a nearly square form is incident to a fast optical attenuator 13. The fast optical attenuator 13 attenuates the beam light quantity (energy) of the incident beam LB1, for example, into six discrete stages or continuously without stages. While the laser beam exposes the pattern of the reticle R through the projection lens PL to the wafer W, the fast optical attenuator 13 can change the attenuation rate at high speed. The fast optical attenuator 13 is arranged such that an the attenuator has two shading grids having a transparent portion and an opaque portion in the laser beam path are arranged with a definite interval and movable relative to the laser beam path.

FIG. 2 is a diagram illustrating an example of a fast optical attenuator 13. The fast optical attenuator 13 comprises two shading grids 16a, 16b, and a grid drive member 16c. The shading grids 16a and 16b are made in that opaque portions to ultraviolet rays are formed by evaporation of chromium or the like in stripe shape with suitable distance onto a glass plate of material such as quartz glass having good transmittance to ultraviolet rays. The two grids 16a, 16b are arranged facing each other and with a suitable distance between them and are parallel to each other. One grid 16a is fixed to the laser beam LB1, and other grid 16b is coupled with the grid drive member 16c and moved slightly in the pitch direction of the grid by command from a light quantity controller 14.

FIGS. 3a and 3b are operation explanation diagrams viewing these shading grids from the upper side in a partial enlargement. The pitch of the grids is made $G_p$, and width of an opaque portion (shading portion) is made $G_w$. In FIG. 3a, the two facing grids are not shifted, at all but are coincident with each other in the transparent portions and the shading portions respectively. In this case, the attenuation rate to the incident light LB1 becomes $G_w/G_p$. In FIG. 3b, the shading grid 16a (fixed) and the shading grid 16b (movable) are shifted by $\Delta d$. In this case, the attenuation rate to the incident light LB1 becomes $(G_w+\Delta d)/G_p$. Where $\Delta d$ is in range of $G_w > \Delta d$.

For example, if $G_p$ is made 10 μm and $G_w$ is made 2.5 μm, according to the above-mentioned constitution, the emitted beam LB1a can be attenuated to the incident beam LB1 in range from 75% to 50%. In the case of this example, since the maximum of the displacement $\Delta d$ is specified by $G_w$, the maximum displacement quantity of the movable grid 16b is less than 2.5 μm. Even if the grid drive member 16c contains, for example, a piezo-element having a high speed response property at a very small stroke, sufficient attenuation performance can be done. Consequently, the fast optical attenuation to a repeated frequency 100–500 Hz in the case of a general eximer laser or the like can be realized in that it can follow each pulse emission completely and be controlled.

Returning to the description of FIG. 1, the nearly parallel beam LB1a receiving the predetermined attenuation by the fast optical attenuator 13 passes through the speckle reducer 20 so as to smooth the speckle pattern including the interference fringes within the beam section. The beam LB1a becomes the oscillation beam oscillating in one dimension (or in two dimensions) by a very small angle in the speckle reducer 20, and then the direction of the optical path is turned by the mirror 21 and the beam LB1a is incident to the fly-eye lens 28 as the optical integrator.

The fly-eye lens 28 is formed by having a plurality of rod-shaped element lenses bundled. The exit end of the fly-eye lens 28 is provided with two-dimensional light source images by the number of the element lenses (in this case, respective condensing spots of the partial luminous flux of the beam LB1a). Consequently, if the beam LB1a made into an oscillation beam by the speckle reducer 21 is incident to the fly-eye lens 28, the incident angle of the beam LB1a at the incident plane of of the fly-eye lens 28 varies every moment.

FIG. 4 shows the relation between the incident beam of the fly-eye lens 28 and the two-dimensional light source image (spot light), and is typical of the principle disclosed in U.S. Pat. No. 4,619,508. Each rod lens 28a of the fly-eye lens 28 is a square pole of quartz having convex spherical surfaces formed on both ends, If the beam LBb in parallel to the optical axis AX (parallel luminous flux) is incident to the fly-eye lens 28, the spot light $SP_b$ is condensed to the exit end of each rod lens 28a or to position projecting from the exit end into the space by prescribed quantity. Although the spot light $SP_b$ is represented only regarding one rod lens in FIG. 4, the spot light $SP_b$ is formed in all emission sides of the rod lens illuminated by the beam $LB_b$ and each spot light $SP_b$ to the beam $LB_b$ is condensed nearly at the center of the rod lens emission surface. Further if the parallel beam $LB_c$ slanted to the right with respect to the optical axis AX is incident to the fly-eye lens 28, the beam $LB_c$ is condensed as the spot light $SP_c$ to the left of the emission surface of each rod lens 28.

Thus according to the one-dimensional oscillation of the beam within the speckle reducer 20, plural spot lights produced at the emission side of each rod lens of the fly-eye lens 28 are all moved in reciprocation motion simultaneously in one direction with respect to the fly-eye lens 28 (optical axis AX).

Most of the plural beams each comprising the spot lights produced at the emission sides of the fly-eye lens 28 pass through the beam splitter 29 and are incident to the condenser lens 30 and overlaid respectively on the reticle R as shown in FIG. 1. Thereby the reticle R is illuminated in nearly uniform distribution of the intensity of illumination, and the pattern of the reticle R is transcribed by the projection lens PL to the resist layer of the wafer W on the stage in the predetermined exposure quantity. That is, the beam being incident to the fly-eye lens 28 is oscillated as above described, the speckle reducer 20 oscillates the interference fringes produced on the reticle surface or the wafer surface (one-dimensional speckle pattern) at the very small displacement quantity, and at the finishing state of the exposure, the shading fringes transcribed to the resist layer are smoothed as a result and the visibility of the interference fringes can be reduced. A pupil (entrance pupil) ep of the projection lens PL is telecentric at the side of image (wafer), and a plurality of spot lights produced at the exit end of the fly-eye lens 28 are focused again to the pupil ep thereby so-called köhler illumination system is constituted.

In the embodiment, when the speckle pattern is smoothed, the laser light being incident to the fly-eye lens 28 is oscillated in one-dimensional direction. In other configurations, however, the oscillation in the two-dimensional direction may be performed, for example, the rotary diffusing plate may be rotated in synchronization with the emission of the pulse light.

The plurality of beams each comprising the spot lights produced at the emission sides of the fly-eye lens 28, a part thereof is divided by the beam splitter 29 and condensed by the condenser optical system 23 to the light receiving element 24. The light receiving element 24 is photosensitive device such as a PIN photo diode having the sufficient sensitivity at ultraviolet band, so that a photoelectric signal corresponding to the light quantity of each light emission of the beam LB0 (or LB1) is outputted accurately. The photoelectric signal from the light receiving element 24 is inputted to the light quantity monitor 26, where the light quantity in each pulse emission is integrated in sequence. The light receiving element 24 and the light quantity monitor 26 constitute the light quantity measuring means in the invention. The measured value may be a value corresponding to the actual light quantity, but need not be the light quantity itself. This applies to later case. This value is transmitted to the main control system 8. The main control system 8 transmits command signals t the trigger controller 9, the light quantity controller 14 and the speckle controller 22 respectively, and controls the operation of the whole apparatus.

The I/O equipment 7 installed on the main control unit 8 is a man-machine interface between the operator and the whole apparatus, and receives various sorts of parameters required for the exposure from the operator and informs the state of the apparatus to the operator.

The memory 6 connected to the main control system 8 stores parameters (constant), data tables and the like inputted from the I/O equipment 7 and required for the exposure operation and various sorts of arithmetic operations. In one embodiment, the information to determine the minimum emission pulse number required for smoothing the speckle pattern well during oscillation of the beam by half period is stored in the memory 6. In this case, the half period of the beam oscillation corresponds to that in order to move the spot light in sequence of $SP_a \rightarrow SP_b \rightarrow SP_c$ (or reversely) in FIG. 4, the beam is inclined by the oscillation angle $\alpha$ in sequence of $LB_a \rightarrow LB_b \rightarrow LB_c$ (or reversely).

The main control system 8 determines the average light quantity value of each pulse light by the first arithmetic unit 81 within the main control system 8 based on the pulse number required for smoothing the speckle patterns each previously stored in the memory 6 and data relating to the proper exposure quantity of the resist coated on the wafer w.

The main control system 8 calculates the object value corresponding to the object integrated light quantity to be supplied to the wafer W when each pulse is illuminated in the average light quantity value determined by the second arithmetic unit 82 within the main control system 8. further calculates the difference between the object value and the measured value transmitted from the light quantity monitor 26 by the third arithmetic unit 83. The main control system 8 outputs the command for adjusting the light quantity in the fast optical attenuator 13 to the light quantity controller 14 based on the difference.

The main control system 8 outputs the drive signal to the speckle controller 22 so that the pulse emission of the laser source 10 and the deflection angle of the beam by the speckle reducer 20 are synchronized. The synchronization may be performed so that signals of start and stop of oscillation are outputted to the trigger controller 9 following the output of a detector (not shown) for monitoring the deflection angle of the beam at high accuracy.

Although the fast optical attenuator 13 contains the two shading grids described above, the fast optical attenuator 13 is not limited to this. The polarizing plate may be rotated, for example, when the laser beam LB0 (LB1) is made linearly polarized light. In this case, the rotary position of the polarizing plate is varied thereby the transmittance of the beam can be varied continuously.

Also an etalon for narrowing the wavelength band of the laser may be used as the fast optical attenuator 13. In general, the etalon is constituted in that two glass plates (In this case, quartz glass is used to raise transmittance to the ultraviolet rays.) are held in parallel with the prescribed distance. The etalon has high transmittance to the specified wavelength corresponding to the distance. An example of the structure of a fast optical attenuator using the etalon is shown in FIG. 5.

The fast optical attenuator in FIG. 5 comprises two quartz glass plates 40 to comprise an etalon, a spacer 41 for holding the plates 40 in parallel with a definite distance, a holding frame 45 for holding the etalon, an actuator 42 for slightly rotating the etalon about a fulcrum 44, and a spring 43 for attracting the holding frame 45 to a fixed portion 46.

In the etalon apparatus with such a structure, if the distance between the two glass plates 40 is made d and inclination angle to the vertical surface with respect to the optical axis is made $\theta$, the highest transmittance is exhibited to the light of wavelength $\lambda$ satisfying relation of $$2d \cdot \cos\theta = m\lambda \qquad (1)$$

Where m is integer, and, for example, under condition that $\theta=0$ degree, d=59.984 μm, $\lambda$=248.38 nm, the maximum transmittance is exhibited in value of m=483. Saying this differently under a condition where m is constant, and the angle $\theta$ is made variable the wavelength $\lambda$ to obtain the maximum transmittance can be varied.

FIG. 6 shows a typical example of transmittance T to wavelength of the etalon. As shown in FIG. 6, characteristics of the transmittance T to the wavelength of the etalon become band-pass filter characteristics of so-called comb type, and portions having the high transmittance T exist at nearly regular intervals depending on the degree of m. The wavelength interval R between peaks of the transmittance T is generally called free spectral range, and when relation of equal (1) is satisfied, the wavelength interval R becomes $$R = 2d \cdot \cos\theta/m - 2d \cdot \cos\theta/(m+1) \qquad (2)$$

Value of quality factor Q of the filter in each band is called "finesse", and this is expressed by R/$\Delta$B. $\Delta$B as shown in FIG. 6 represents half-width of one peak of the filter (half-width: wavelength distribution width corresponding to $\frac{1}{2}$ of maximum).

When the etalon having these characteristics and as shown in FIG. 5 is used as the fast optical attenuator 13, it is favorable to use the etalon having the wavelength band width slightly wider than that of the laser light. Since the wavelength band width of the laser used in such exposure apparatus ia bout 5/1000−3/1000 nm, it is favorable to use the etalon having the frequency band width of 10/1000 nm or more.

FIG. 7 shows the principle of attenuating the laser light using an etalon. In FIG. 7, (a) shows the intensity distribution to the wavelength of the laser generated from the pulsed laser source 10, and the band width is about from 3/1000 nm to 5/1000 nm. The center wavelength $\lambda$ is stabilized in the pulsed laser source 10 or at the outside, and the stability is controlled to 1/1000 nm or less. On the other hand, characteristics of the etalon used as the fast optical attenuator have filter characteristics of comb type as shown in FIG. 7(b). When the etalon is actually used as the fast optical attenuator 13, the center wavelength $\lambda$m of the filter is controlled between $\lambda$o±$\Delta$B with respect to the band width $\Delta$B of the filter (In the actual use, control may be performed between $\lambda$o+$\Delta$B∼$\lambda$o or between $\lambda$o−$\Delta$B∼$\lambda$o). Control of the center wavelength m of the filter can be accomplished by changing the inclination angle of the etalon as above described.

The laser intensity after passing through the fast optical attenuator is determined by product of profile in FIG. 7(a) and profile in (b), and the laser of the power distribution as shown in FIG. 7(c). In this case, if $\lambda$o and $\lambda$m are coincident completely, the maximum transmittance can be obtained and the transmittance actually becomes 90% or more. On the other hand, when setting to $\lambda$o attenuation is performed as $\lambda$m=$\lambda$o−$\Delta$B, a transmittance value of about 10% can be obtained (Similar effect can be obtained in $\lambda$m=$\lambda$o+$\Delta$B). Also if $\lambda$o is set to value slightly less than value of $\lambda$m=$\lambda$o−$\Delta$B, the transmittance of about 0% can be obtained.

In the actual control, the transmittance of light to the angle of the etalon is previously measured and this data is stored in the memory 6. The angle control quantity of the etalon to the desired transmittance is estimated and thereby the drive command may be given to the actuator 42.

For example, when the etalon having the distance between both glass plates being 60 m is used and the attenuation control is performed to the laser of the center wavelength $\lambda$o=248.380 nm, $\lambda$o and $\lambda$m are coincident in the angle $\theta$=6.5262 degree. The degree of m in this case is 480. Since the center wavelength at the degree m=481 different from 480 by one is $\lambda$m=247.864 nm, the free spectral range of the etalon becomes 0.516 nm. If finesse is F=10, the half-width $\Delta$B of the band becomes about 0.05 nm. Consequently, if a shift of the center wavelength by 0.05 nm is performed, the transmittance becomes about 10% and the angle $\theta$ in this case becomes 6.4246 degree. Consequently, according to the inclination of the etalon of about 0.1 degree, the transmittance can be controlled from 90% to 10%. When a drive is performed to the rotational center 44 of the etalon at the position of radius 50 mm, in order to control the inclination of about 0.1 degree, the displacement of about 90 μm may be given at the drive point. Since the transmittance can be controlled from 90% to 10% by the displacement quantity of such degree, if a piezo-element or the like is used as the actuator 44 for the actual use, the drive is possible at sufficiently high speed.

Such fast optical attenuator 13 is not limited to the arrangement position shown in FIG. 1, but similar effects can be obtained also when the attenuator 13 is entered between the pulsed laser source 10 and the expander 12 or between the resonator mirrors within the pulsed laser source 10. Further when a system of small angle oscillation of the beam as above described is not done in the speckle reducer, the fast optical resonator may be entered between the speckle reducer 20 and the fly-eye lens 28.

At any rate, the fast variable attenuator 13 must be entered at the stage before the laser light is incident to the fly-eye lens 28. This is because the transmittance of the etalon is also dependent on the value of the distance. It is preferable that the distance value be as uniform as possible and is held to the whole range of the transmission portion of the etalon. However, due to the manufacturing lateness or the like, maintaining the same transmittance throughout the whole surface is impossible in the actual position. Consequently, in order to eliminate deterioration of uniformity of the intensity of illumination due to the etalon (unevenness of the intensity distribution at the beam section) by the fly-eye lens, the etalon is preferably inserted into the front stage of the fly-eye lens. Use of a etalon has the advantages that the controllable attenuation ratio can be large, the maximum transmittance is high, and unevenness of the intensity of illumination or interference (generated from the grid edge) is not liable to exist in comparison to the system using the shading grid shown in FIG. 2.

Still another example of the fast optical attenuator 13 is disclosed as a transmission type double phase grating shown in FIG. 8. Such phase grating is constituted in that two transmission type diffraction gratings 50a, 50b having predetermined step difference in definite pitch are held in parallel with prescribed distance. If the refractive index specified by material of the grating (In this case, material transparent to ultraviolet rays is used.) is made n, the step difference d of the diffraction gratings 50a, 50b becomes $$d = \lambda/2(n-1) \tag{3}$$

Where $\lambda$ is wavelength of the light transmitting the phase grating.

When the two phase gratings are arranged by shifting with a definite quantity as shown in FIG. 8, the optical path (hereinafter referred to as "path") is classified into four sorts, i.e., A (concave - convex), B (convex - convex), C (convex - concave) and D (concave - concave). Among these paths, the path A and the path C are entirely the same in the optical path length, but the path B in comparison to the path A has the optical path difference of $d(n-1)$ (where the refractive index of air is made 1). Consequently, the optical path difference between the path A and the path B becomes $\lambda/2$ from equation (3), and the transmission lights of the path A and the path B interfere with each other and cancel each other. As a result, the transmittance of light by the two phase gratings is decreased. The degree of the light attenuation is dependent on the shift quantity ($\Delta x$) of the two phase gratings. In similar manner to the above description, the transmission lights of the path B and the path C, the transmission lights of the path C and the path D, and the transmission lights of the path D and the path A respectively interfere with each other and are therefore attenuated. Also in the case of this system, the concave/convex pitch of the diffraction gratings 50a, 50b may be about 10 μm. Consequently, the actuator for relatively moving the two diffraction gratings 50a, 50b may be constituted by using a piezo-element thereby the high speed drive becomes possible.

Figure 9:
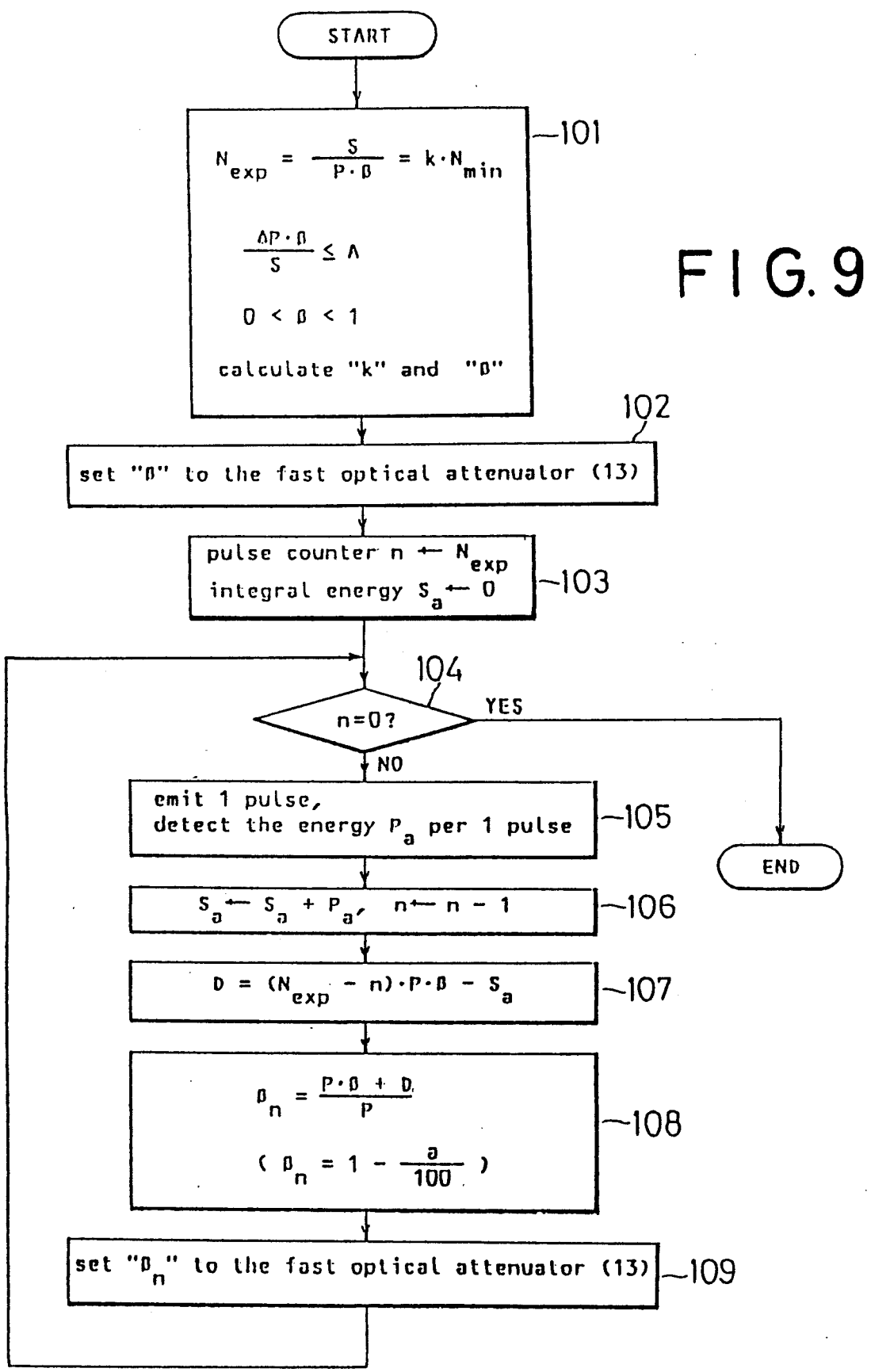
FIG. 9 is a flow chart illustrating the operation of the embodiment in FIG. 1.

Operation of the embodiment in FIG. 1 will be described using a flow chart in FIG. 9.

After the operation is started, first, at step 101, based on the data of the minimum required pulse number Nmin for reducing the speckle stored previously in the memory 6, the optimum (object) total exposure quantity S adapted for the property of the resist coated on the wafer, and the allowable accuracy of the exposure quantity control, the average light quantity value per one pulse is calculated by the first arithmetic unit 81 provided on the main control system 8.

The minimum required pulse number Nmin for reducing the speckle is a value depending on to what degree the visibility of the speckle (including one-dimensional interference fringes) should be reduced. If the number Nmin is made large, influence of the speckle is so much decreased and unifying of the intensity of illumination can be intended. However, if the number Nmin is made too large, the exposure time becomes long and the through-put as the exposure apparatus is lowered. Consequently, the number Nmin is set to an optimum value considering these conditions.

On the other hand, if the average exposure energy per unit pulse (under the initial attenuation value set by the fast optical attenuation 13 before the exposure) is made P and the total energy to one exposure region on the wafer W (the aimed proper exposure quantity) is made S, when a plurality of unit pulses with the average exposure energy P are illuminated and the total energy S is exposed to one exposure region on the wafer W, the pulse number Nexp required for exposing the total energy S becomes Nexp=iNT (S/P). Where the function iNT(α) represents that the real number α is added by 0.5 and then rounded into the integer.

The exposure pulse number Nexp must be integer times of the Nmin so as to reduce the speckle. Therefore $$N_{exp} = \frac{S}{P \cdot \beta} = k \cdot N_{min} \tag{4}$$

Where k is integer being 1 or more, and $\beta$ is coefficient called average attenuation rate and in range $0 < \beta < 1$.

If variation of the light intensity per each pulse is made $\Delta P$, when the light quantity is controlled in each pulse, since error of the final integrated exposure quantity becomes variation of the intensity of the final pulse $\Delta E = \Delta P \cdot \beta$, this may be within the allowable error of the exposure quantity control.

That is, if the exposure quantity control accuracy is made A, $$\Delta P \cdot \beta / S \leq A \tag{5}$$

$$\therefore \beta \leq A \cdot S / \Delta P$$

From equation (4), since $$\beta = \frac{S}{P \cdot k \cdot N_{min}} \quad \frac{S}{P \cdot k \cdot N_{min}} \leq A \cdot S/\Delta P$$

is established, Consequently $$k \geq \frac{\Delta P}{A \cdot P \cdot N_{min}} \tag{6}$$

Since $\beta$ is 1 or less, $$\frac{S}{P \cdot k \cdot N_{min}} \leq 1$$

$$\therefore k \geq \frac{S}{P \cdot N_{min}} \tag{7}$$

Thus the integer value k satisfying equations (6) and (7) is estimated and the exposure pulse number Nexp is determined, and the average attenuation rate $\beta$ (hence the average light quantity value $P \cdot \beta$) may be determined.

For example, if the average energy P of one pulse is 2 mJ/cm², the proper exposure quantity is 153 mJ/cm², and Nmin is 50 pulses, the pulse required in the case of only the proper exposure control becomes 77 pulses. Where, since k·Nmin must be made integer times of 50 as above described, the exposure is performed at k=2, that is, at Nexp=100 pulses. Then the average attenuation rate $\beta$ becomes 0.765. Also if variation of the exposure energy of one pulse is made ±10%, ΔP becomes ±0.2 mJ/cm$^2$ and therefore β·ΔP becomes ±0.153 mJ/cm$^2$.

Subsequently, at step 102, the attenuation rate of the fast optical attenuation rate of the fast optical attenuator 13 is set to β, and at step 103, the count value n of the pulse counter and the value Sa corresponding to the integrated light quantity of the light quantity monitor 26 are set to Nexp and zero, respectively. At next step 104, judgment is performed regarding whether the value n of the pulse counter is zero or not. If it is not zero, the process advances to step 105. At step 105, the trigger controller 9 transmits the trigger signal to the pulsed laser source 10 where one pulse is emitted, and the value Pa corresponding to the actual light quantity of the emitted pulse is detected based on the output of the light receiving element 24. At subsequent step 106, the set value of the integrated light quantity in the light quantity monitor 26 is varied to Sa+Pa, and the set value of the pulse counter is varied to n−1.

Next, at step 107, according to equation (8), the object integrated light quantity to be given by the average light quantity Pβ determined in the previous step 101 is estimated by the second arithmetic unit 82, and the difference D between the object integrated light quantity thus estimated and the integrated light quantity measured by the light quantity monitor 26 is estimated by the third arithmetic unit 83.

$$D = (Nexp - n) \cdot P \cdot \beta - Sa \quad (8)$$

Based on the difference D, the attenuation rate βn in the next pulse is determined by equation (9).

$$\beta n = (P \cdot \beta + D)/P \quad (9)$$

When variation of the exposure energy of each pulse light is made a%, if βn>1−a/100, βn is made βn=1−a/100 (maximum transmittance).

At step 109, the attenuation rate of the fast optical attenuator 13 is set by the light quantity controller 14 to βn determined at the previous step 108, and the process is returned to step 104. At step 104, judgment is performed regarding whether the value n of the pulse counter is zero or not in a similar manner to the above description. If it is not zero, the process advances to step 105 and a similar operation to the above description is performed, and the process is returned to step 104 again and if it is zero the exposure operation is finished.

Figure 10:
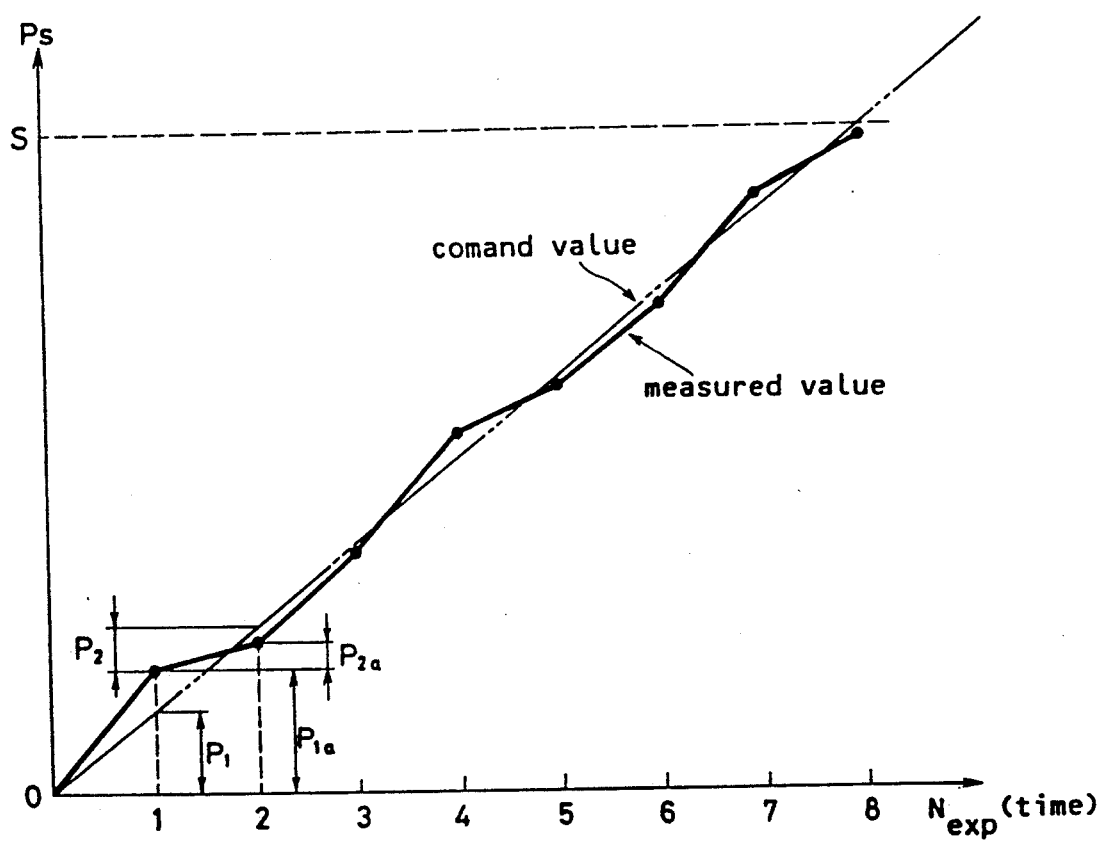
FIG. 10 is a graph illustrating the state of the exposure quantity control in the embodiment of FIG. 1.

The state of the exposure quality control in the embodiment will be described using a graph illustrating the relationships between the pulse number and the integrated exposure quantity shown in FIG. 10. FIG. 10 shows the case that the exposure is finished by 8 pulses, and abscissa represents the pulse number Nexp and ordinate represents the integrated exposure quantity.

In FIG. 10, straight line shown by dash-and-dot line represents the object value of the integrated light quantity to be given by the pulse light with the average light quantity value determined at step 101, and in the invention the light quantity is controlled per each pulse so that the exposure is performed in accordance with the object value.

If at the first pulse light is emitted aiming the exposure quantity being $P_1$ and the exposure quantity detected actually after the emission is $P_{1a}$, the second pulse is emitted at setting to the light quantity being $P_2 = 2P_1 - P_{1a}$.

Also if the measured value of the light quantity of the second pulse is $P_{2a}$, the third pulse is emitted at the light quantity set to $3P_1 - P_{1a} - P_{2a}$. This is repeated until the exposure is finished at the eighth pulse in the state that shift from the object line by dash-and-dot line is little. The final control accuracy (error to the proper exposure quantity) becomes only the light quantity error of the eighth pulse.

In the embodiment, in order to set next pulse light, the light quantity of the next pulse is set from the difference between the object value of the integrated exposure quantity after emission of next pulse and the past integrated light quantity. However, if any tendency exists in the variation of each pulse, the ratio of the object value per each unit pulse and the measured value per each unit pulse is averaged to the plural pulses at the past, and new object the value may be set by value that the object value is divided by the average value of the ratio.

Also in the embodiment, the pulse energy emitted from the light source is the coherent laser light. However, when the light source of the exposure apparatus is pulse energy being substantially non-coherent, i.e., non-coherent pulse light energy, or when the light source is coherent light energy but the degree of coherency does not become a problem during the pattern transcribing, or further when pulse energy of X-ray for example in addition to the light is emitted, since the reduction of the speckle need not be considered, the necessary pulse number is determined based on the variation range of the pulse energy and the allowable control accuracy. The object value per each pulse may be set from the necessary pulse number and the optimum exposure quantity. Since the error to the final proper exposure quantity is determined by the error of the final pulse, the energy quantity of one pulse may be set so that variation of the light quantity of one pulse is within the allowable error.

Figure 11:
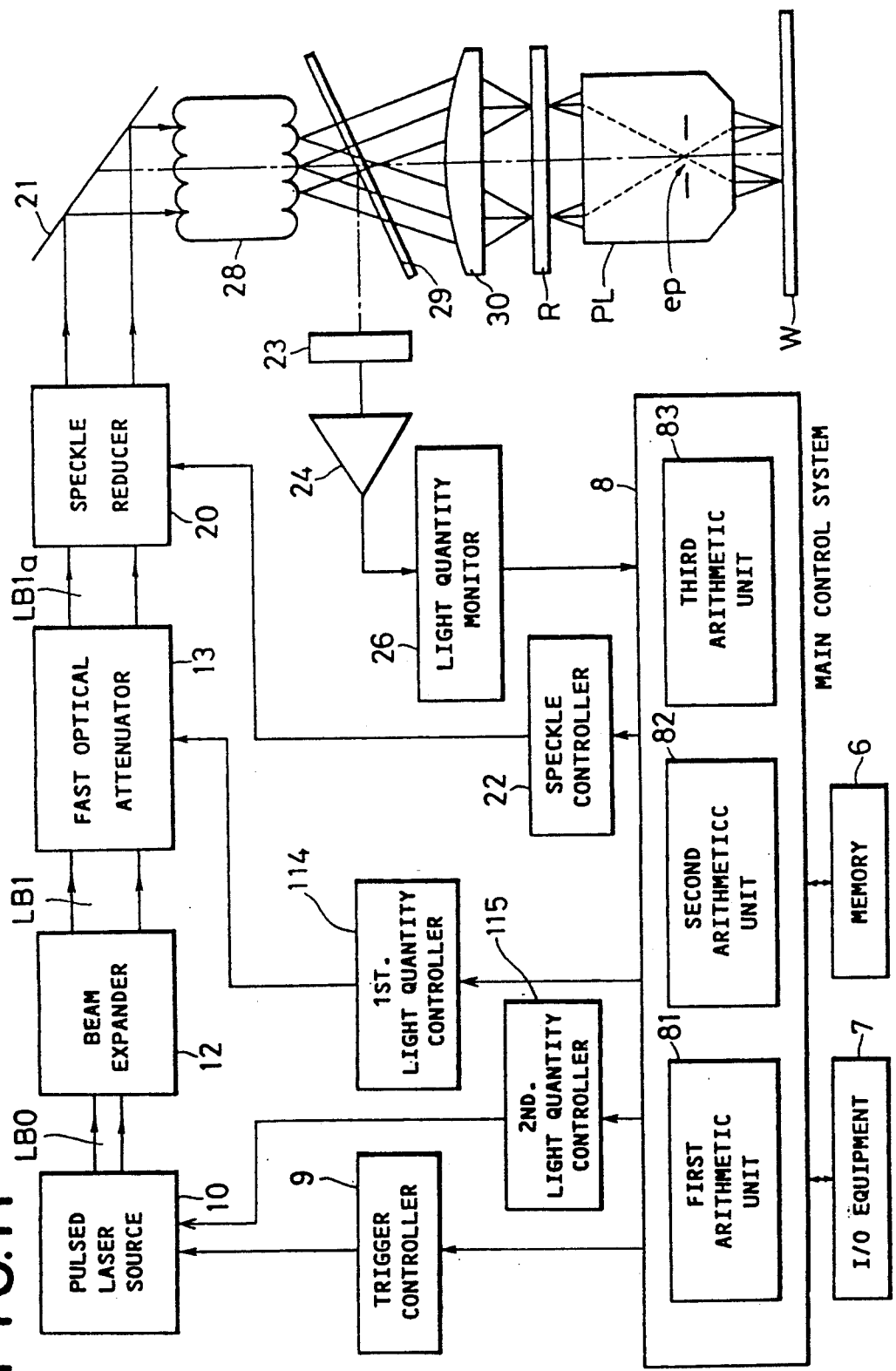
FIG. 11 is a schematic block diagram showing the construction of an exposure control apparatus according to another embodiment of the present invention.

FIG. 11 shows another embodiment of the present invention. This embodiment differs from the embodiment of FIG. 1 in that a second light quantity controller 115 for controlling the high-tension discharge voltage of the pulsed laser source 10 is further provided in addition to the first light quantity controller 114 for controlling the fast optical attenuator 113.

In this embodiment, the fast optical attenuator 113 is composed of a turret plate which are provided for example with six mesh filters having different attenuation rates or transmittances. In other words, the attenuation rate of the fast optical attenuator 113 is selected in accordance with the number of exposure pulses Nexp and the proper exposure light quantity prior to the beginning of the exposure and it will never be changed to another value at least during one shot or exposure. In other words, it is suffice for the attenuator 113 provided that it has a function of always attenuating the light quantity of all the pulse beams uniformly at a given attenuation rate unless there is any change in the proper exposure light quantity per shot in accordance with the exposure condition of the wafer or the sensitivity of the resist. Therefore, the attenuator 113 can serve the purpose if it comprises a light quantity adjusting mechanism having a relatively low attenuation change-over response speed.

Figure 12:
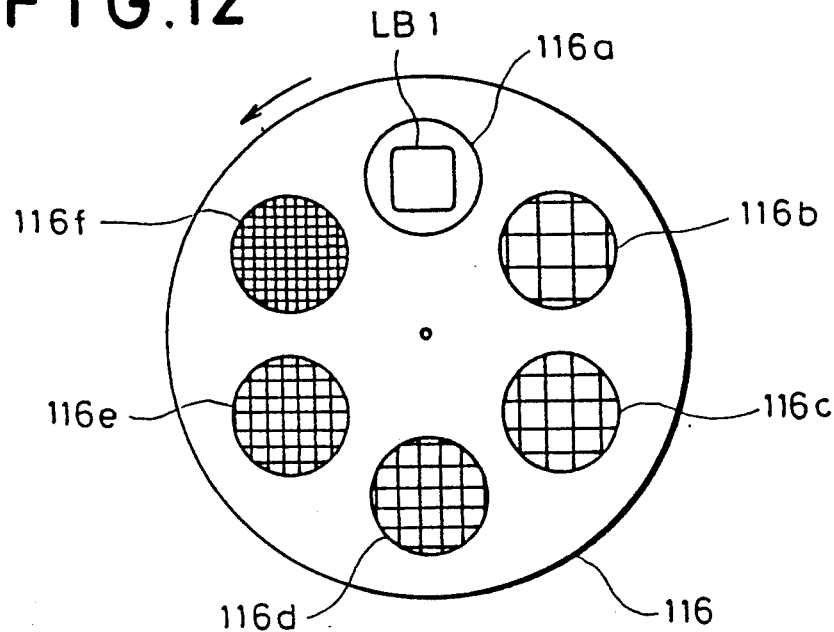
FIG. 12 is a plan view showing an example of a rotary turret plate.

As shown in FIG. 12, the rotary turret plate 116 includes six different mesh filters 116a to 116f. The filter 116a is a transparent aperture and its attenuation rate is 0% (that is, the transmittance is 100%). It is constructed so that the filters 116a to 116f are arranged at six positions along the circle centering the rotary shaft of the turret plate 116 at intervals of about 60° and any one of the filters is placed in the optical path of the beam LB1 from the expander 12.

Figure 13:
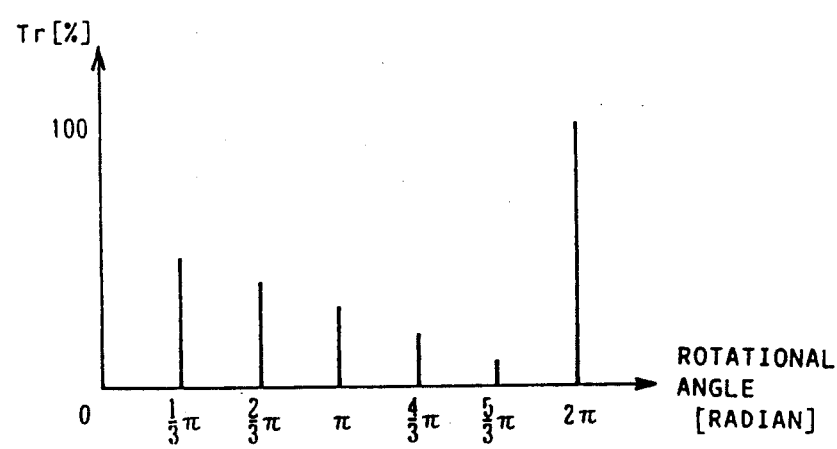
FIG. 13 is a graph showing the relationship between the rotational angle and the transmittance of the rotary turret plate.

FIG. 13 shows the relationship between the rotational angle of the turret plate 116 and the transmittance Tr.

Assuming that the rotational angle is zero when the filter 116a is positioned in the optical path of the beam LB1, the turret plate 116 is rotated counterclockwise (the direction of an arrow) in steps of about 60° ($\pi/3$) within the paper plane of FIG. 12 so that the beam LB1 is attenuated at the rates shown in FIG. 13. Note that a plurality of dielectric mirrors of different transmittances may be used for the optical attenuating elements mounted on the turret plate 116. Alternatively, by arranging a pair of turret plates to be apart by a given distance and rotatable relative to each other and selecting for example that the transmittances of the optical attenuating elements of the first turret plates are respectively 100%, 90%, 80%, 70%, 60% and 50% and the transmittances of the optical attenuating elements of the second turret plate are respectively 100%, 40%, 30%, 20%, 10% and 5%, it is possible to realize 36 different transmittances through the combination of the two.

Still alternatively, a fast variable optical attenuator of the same type as in FIG. 1 may be used for the attenuator 113.

In addition to the outputting of signals to the trigger controller 9 and the speckle controller 22 in accordance with the measured value of the light quantity monitor 26, the main control system 8 sends command signals to the first light quantity controller 114 and the second light quantity controller 115 to control the operation of the apparatus on the whole.

As in the case of the embodiment of FIG. 1, the main control system 8 includes, a first arithmetic unit 81 for determining the average light quantity value of each pulse light in accordance with the number of pulses required for speckle pattern smoothing purposes and the data relating to the proper amount of exposure which are preliminarily stored in the memory 6, a second arithmetic unit 82 for calculating an object value corresponding to a target integrated light quantity which is to be applied to the wafer W when each pulse is applied with the average light quantity value, and a third arithmetic unit 83 for calculating the difference between the thus calculated object value and the measured value sent from the light quantity monitor 26. The second light quantity controller 115 controls the voltage applied to the pulsed laser source 10 in such a manner that the light quantity of the next pulse light to be applied is corrected from the average light quantity value in accordance with the calculated difference. In other words, the voltage applied to the pulsed laser source 10 is adjusted by an amount corresponding to the correction.

Figure 14:
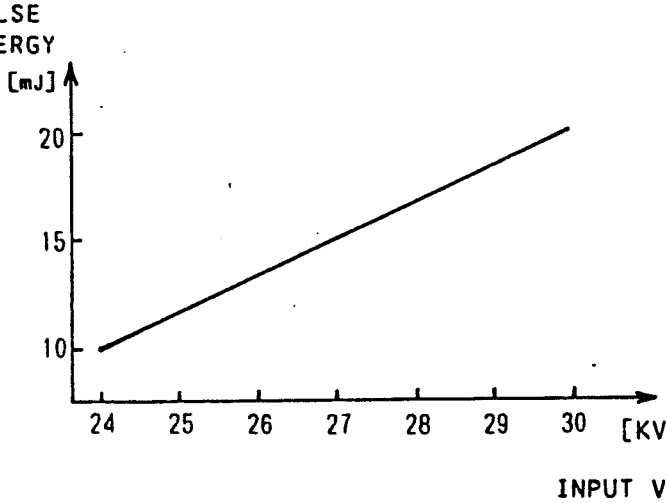
FIG. 14 is a graph showing the relationship between the input voltage and the output pulse energy of the pulsed laser source.

FIG. 14 shows the relationship between the applied voltage to the pulsed laser source 10 and the light quantity (pulse energy of its emitted pulse) and it will be seen that there is substantial proportionality between the two. However, the output is decreased due to deterioration of the mixture gas in the pulsed laser source and therefore the illustrated relationship is varied with the lapse of time. To deal with this variation, it is necessary to successively correct the actual applied voltage in accordance with the exposure energy information obtained. It is to be noted that this correction can be a correction of the relationship between the applied voltage and the exposure energy or alternatively it can take the form of a method of varying the correction factor with respect to the initial relationship.

The second light quantity controller 115 of the applied voltage control type may be replaced with an optical device which provides for example continuous variations in the transmittance (attenuation rate). More specifically, it may be one which combines a rectangular aperture and a zoom lens systems as to change the zoom ratio the aperture diameter and thereby to continuously attenuate the light quantity. Alternatively it may be one employing the two shading gratings shown in FIG. 2, the etalon shown in FIG. 5, the two phase gratings shown in FIG. 8 or a rotary polarizing plate in the case of a linearly polarized laser.

It is to be noted that the fast optical attenuator should preferably be servo controlled for transmittance adjusting purposes. For instance, where the two shading gratings of FIG. 2 are used, a pair of photo couplers are arranged so as to interpose the shading gratings therebetween. Then, by constructing so that a driver 16c is servo controlled using the outputs of these detectors, it is possible to adjust the amount of relative movement of the two shading gratings with a high degree of accuracy. In this case, if the outputs of the light emitting elements of the photo couplers are not stable, the measurement accuracy of the detectors is also deteriorated. Thus, it is preferable to detect a part of the beam produced from the light emitting element by a separate photoelectric sensor so that the detected value is used to divide the output of each photo coupler.

It is to be noted that where a fast optical attenuating device is used in place of the second light quantity controller 115, it is only necessary to arrange the device in any of the optical paths before the fly-eye lens 28 as in the case of the optical attenuator 113.

Then, the degree of adjustment by the second light quantity controller 115 is set to a value which is slightly smaller than the maximum value of the controllable exposure energy in consideration of the variations in the exposure energy of each pulse generated from the pulsed laser source 10.

Then, during one shot or exposure, after the first pulse light has been emitted on the basis of this set value, the second pulse and the following pulses are successively controlled to the control value calculated by the main control system 8.

In this connection, the exposure energy control range of the second light quantity controller will be described. If the pulse light is produced N times during one shot or exposure, the variation of the actual integrated light quantity I (actual measured value) with respect to the target integrated light quantity P·N (the proper exposure light quantity S) is given by the following expression (10).

$$P\left(N - (\Delta P/P) \cdot \frac{1 - (\Delta P/P)^N}{1 - (\Delta P/P)}\right) \leq 1 \leq P\left(N + (\Delta P/P) \cdot \frac{1 - (\Delta P/P)^N}{1 - (\Delta P/P)}\right) \tag{10}$$

As will be seen from the above expression (10), the control ratio of the second light quantity controller becomes as $\{1\pm(\Delta P/P)/(1-\Delta P/P)\}$. Therefore, in order that the maximum value $\{1/(1-\Delta P/P)\}$ of the control ratio does not exceed the maximum value of the exposure energy control range, it is only necessary that the average control value of the second light quantity controller be selected to be less than $(1-\Delta P/P)$ times the maximum value of the control range. In other words, in the case of the present embodiment the second light quantity controller 115 is required to set the applied voltage in accordance with the relationship shown in FIG. 14 so that the average exposure energy P becomes less than $(1-\Delta P/P)$ times the maximum output of the pulsed laser source 10. For instance, since it is generally about $(\Delta P/P) = 10\%$ in the case of the excimer laser, if the maximum output of the pulsed laser source 10 is 10 mJ/cm$^2$, it is only necessary to set the applied voltage such that the exposure energy P is not greater than 9 mJ/cm$^2$. In fact, it is desirable to set the applied voltage in such a manner that the exposure energy P is not greater than for example 5 mJ/cm$^2$ in consideration of decrease in the output due to deterioration of the mixture gas of the laser, the life of the optical components, etc.

On the other hand, where a fast optical attenuator comprising optical elements is used in place of the second light quantity controller 115, its attenuation rate is preliminarily set to about 90% (when $\Delta P/P = 10\%$) and it is successively set to the attenuation rate calculated for each of the second and the following pulses on the basis of the set value. In this case, the applied voltage of the pulsed laser source 10 is controlled only for the purpose of preventing decrease in the laser density of pulse light and maintaining the exposure energy per pulse substantially constant.

It is to be noted that in accordance with the present embodiment, in order to vary the attenuation rate of the attenuator 113 in accordance with the exposure condition of the wafer W, the exposure energy of the second and the following pulse light is subjected to fine adjustment only for the purpose of correcting an error of the integrated light quantity due to the variation in exposure energy between the pulses. Therefor, there is no need to considerably vary the interelectrode discharge voltage in the pulsed laser source 10 or the attenuation rate of the fast optical attenuator 113 and thus the dynamic range of the second light quantity controller 115 can be made small.

Next, the number of pulses Ne required for attaining the desired exposure control accuracy A ($A = I/P \cdot N$) during one shot or exposure will be explained briefly. Since the exposure quantity control of the present embodiment is designed to substantially match the actual integrated light quantity I with the target integrated light quantity P·N by adjusting the exposure energy for every pulse, an error of the final integrated light quantity is caused by the variation in the exposure energy of the final pulse light. As a result, in order to attain the desired exposure control accuracy, it is necessary that the variation in the exposure energy of the final pulse light be within the allowable error of the desired exposure control accuracy. In other words, the exposure energy P must be set to a small value and the number of pulses N ($N=S/P$) required for one shot or exposure must be a somewhat large number. Consequently, the value of $(\Delta P/P)^N$ can be regarded as zero in the previously mentioned expression (10) so that if the respective members are divided by the value of P·N for rearrangement, the exposure control accuracy A is given as follows:

$$|A| \leq \frac{1}{N} \cdot \frac{(\Delta P/P)}{1 - (\Delta P/P)} \quad (11)$$

Here, the number of pulses N required for attaining the desired exposure control accuracy is reduced to a minimum when the exposure control accuracy A has the maximum allowable error in the expression (11), that is, when the following holds $$A = \frac{1}{N} \cdot \frac{(\Delta P/P)}{1 - (\Delta P/P)} \quad (12)$$

As a result, the above-mentioned number of pulses Ne is given by the following equation (13).

$$Ne = \frac{1}{N} \cdot \frac{(\Delta P/P)}{1 - (\Delta P/P)} \quad (13)$$

Therefore, if the exposure is effected with a number of pulses which are at least greater than the number of pulses Ne given by the above equation (13), the control accuracy of $\pm A$ (e.g., if it is 1%, A=0.01) is ensured for the final integrated light quantity I with respect to the target integrated light quantity P·N.

Next, the method of determining the number of exposure pulses Nexp for one shot or exposure will be explained. In general, the number of exposure pulses Nexp is given as Nexp=iNT(S/P). It is to be noted that iNT($\omega$) shows that the fractions of the real value $\omega$ below the decimal point are raised and converted to an integral value.

Then, the pulse light generated from the pulsed laser source 10 is uniformly attenuated at a given attenuation rate $\beta (0 \leq \beta \leq 1)$ by the attenuator 113 and it is then projected onto the reticle. Thus, the number of exposure pulses Nexp is required to satisfy the following conditional expression (14).

$$N\exp = \frac{S}{P \cdot \beta} \quad (14)$$

Also, in order to attain the exposure control accuracy A as mentioned previously, the following expression (15) must be satisfied additionally $$N\exp \geq Ne \quad (15)$$

On the other hand, in order to smooth the interference pattern, the number of exposure pulses must be an integer times the number of pulses Nvib during the half period of the vibrating mirror. Therefore, the number of exposure pulses Nexp is given by the following equation (16)

$$N\exp = m \cdot Nvib \geq m \cdot Nmin \quad (16)$$

Here, m represents an integral value greater than 1 and Nmin represents the minimum number of pulses required for the reduction of speckles. Thus, the attenuation rate $\beta$ of the attenuator 113 is given by the following from the equations (13) to (15)

$$\beta \leq \frac{S}{P} \cdot \frac{A\{1 - (\Delta P/P)\}}{(\Delta P/P)} \quad (17)$$

Also, the integer m is given by the following expression (18) from the equations (13), (15) and (16)

$$m \geq \frac{1}{Nvib} \cdot \frac{1}{A} \cdot \frac{(\Delta P/P)}{1 - (\Delta P/P)} \qquad (18)$$

Also, the attenuation rate $\beta$ is less than 1 and therefore the following expression holds in accordance with equations (14) and (16)

$$m \geq \frac{S}{P \cdot Nvib} \qquad (19)$$

In view of the foregoing, in accordance with the present embodiment the attenuation rate of the attenuator 113 is first determined so as to satisfy the expression (17), that is, one of the filters of the rotary turret plate is selected so as to check whether the number of pulses Nexp calculated from equation (14) on the basis of the attenuator rate of the selected filter satisfies equations (15) and (16). If these equations are not satisfied, another filter of a lower attenuation rate that satisfies equation (17) is selected so that the number of exposure pulses Nexp satisfies equations (15) and (16). When the number of exposure pulses Nexp is determined in this way, it is only necessary to determine the values of m and Nvib so as to simultaneously satisfy expressions (18) and (19).

For example, if the variation $\Delta P/P$ in average exposure energy between the pulses is 10% ($\Delta P/P = 0.1$) and the exposure control accuracy A is 1% ($A = 0.01$), the number of pulses Ne becomes 12 from equation (13). On the other hand, if the average exposure energy P is 2 mJ/cm$^2$, the proper exposure light quantity S is 80 mJ/cm$^2$ and Nmin is 50 pulses when the attenuation rate $\beta$ of the attenuator 113 becomes 1, the number of exposure pulses Nexp becomes 40 pulses from equation (14) and this number of pulses Nexp does not satisfy equation (16). Thus, the attenuation rate of the attenuator 113 is set to a value smaller than 1 so that the number of exposure pulses Nexp calculated on the basis of the set attenuation rate or the average exposure energy P·N calculated from equation 14 satisfies equation (16).

Then, where the attenuation rate of the attenuator 113 can be set continuously, the values of m and Nvib are set in accordance with expressions (18) and (19) since Ne=12 pulses and Nmin=50 pulses. At this time, while various combinations of (m, Nvib) such as (1, 50) (1, 60) and (2, 100) can be conceived, in order to minimize the number of exposure pulses Nexp (Nexp=m·N·vib) in consideration of the throughput, it is set so that m=1 and Nvib=50 and the number of exposure pulses Nexp is set to 50 pulses. If the exposure is effected with Nexp=50, the optimization of the exposure light quantity and the smoothing of the interference pattern can be effected with the minimum number of pulses Nexp. As a result, the attenuation rate $\beta$ of the attenuator 113 is set to 0.80 from equation (14). The value of $\Delta P$ becomes $\pm 0.2$ mJ/cm$^2$ from $\Delta P/P = \pm 10\%$ and the variation $\Delta P \cdot \beta$ of the average light quantity value $P \cdot \beta$ becomes $\pm 0.160$ mJ/cm$^2$. As a result, the variation in the average light quantity value of the final pulse light or the error of the final integrated light quantity can be regarded to be on the order of $\pm 0.160$ mJ/cm$^2$ and it will thus be seen that the exposure control accuracy (1%) is attained fully.

On the other hand, where the setting of the attenuation rate of the attenuator 113 is not continuous (where the attenuator 113 comprises a rotary turret plate), one of the mesh filters of the rotary turret plate that satisfies expression (17) is selected and a check is made whether equation (16) is satisfied by the number of pulses Nexp calculated on the basis of the attenuation rate (e.g., $\beta = 0.5$) of the selected filter from equation (14). In this case, in order to minimize the value of Nexp, the filter having the highest attenuation rate is selected first from those which satisfy equation (17). Where $\beta = 0.50$ (i.e., $P \cdot \beta = 1$ mJ/cm$^2$), there results Nexp=80 pulses and equations (15) and (16) are satisfied. Once the number of pulses Nexp has been determined in this way, since Nexp=80, it is only necessary to determine the values of m and Nvib to simultaneously satisfy expressions (18) and (19) and in this case they are m=1 and Nvib=80.

Then, we will be seen from the foregoing, where the setting of the attenuation rate of the attenuator 113 is not continuous, the attenuation rate cannot always be set to the optimum value determined by calculation and the number of pulses Nexp becomes larger as compared with the cases where the continuous setting is possible, thus giving rise to the danger of making disadvantageous from the throughput point of view. For this reason, it is desirable to use the attenuator 113 of the type capable of continuously setting the attenuation rate, or the non-continuously settable type with the capability of settling the attenuation rate (transmittance) more finely (e.g., the one using the combination of two rotary turret plates) or the like.

Figure 15:
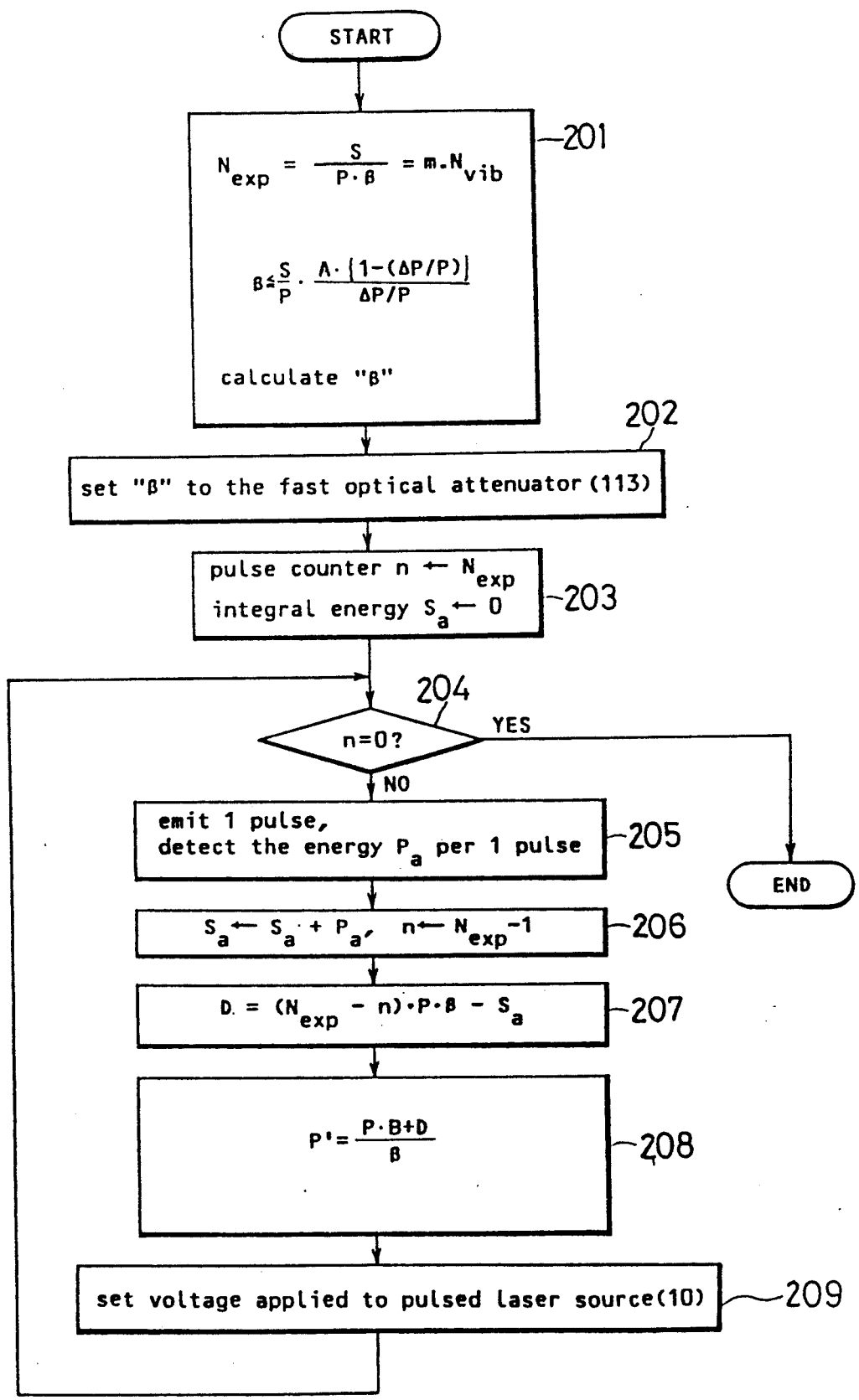
FIG. 15 is a flow chart showing the operation of the embodiment of FIG. 11.

The operation of the present embodiment will now be described with reference to the flow chart of FIG. 15.

Initially, at the first step 201, the attenuation rate $\beta$ (i.e., the average light quantity $P \cdot \beta$) of the attenuator 113 is calculated by the first arithmetic unit 81 in accordance with various data including the optimum (target) total exposure light quantity S corresponding to the resist applied to the wafer, the number of pulses Nmin which is required for smoothing the interference pattern and preliminarily stored in the memory 6 and the number of pulses Ne required for attaining the desired exposure control accuracy.

Then, at a step 202, the turret plate is rotated to set the attenuation rate of the attenuator 113 to $\beta$, and at a step 203, the count n of the pulse counter and the value Sa corresponding to the integrated light quantity of the light quantity monitor 26 are respectively set to Nexp and zero.

At the next step 204, it is determined whether the value n of the pulse counter is zero so that if it is not zero, a transfer is made to a step 205. At the step 205, a trigger pulse is sent from the trigger controller 9 to the pulsed laser source 10 which in turn generates a pulse and also the value Pa corresponding to the actual light quantity of the generated light pulse is detected in accordance with the output of the light receiving element 24. At the next step 206, the integrated light quantity set in the light quantity monitor 26 is changed to Sa+Pa and the set value of the pulse counter is changed to Nexp−1.

Then, at a step 207, the target integrated light quantity which is to be determined by the average light quantity value $P \cdot \beta$ determined at the step 201 is obtained and the difference D between the target integrated light quantity and the actually measured integrated light quantity is determined in accordance with the following equation (20)

$$D = (Nexp - n) \cdot P \cdot \beta - Sa \qquad (20)$$

Then, at a step 208, in accordance with the difference D, the light quantity P' of the next pulse is obtained from the average light quantity value P·β determined at the step 201 through the correction according to the following equation $$P' = \frac{P \cdot \beta + D}{\beta} \quad (21)$$

At the next step 209, the voltage applied to the pulsed laser source 10 is set to a value corresponding to the light quantity P' by the second light quantity controller 115 and a return is made to the step 204. At the step 204, it is determined whether the value n of the pulse counter is zero in the like manner as the previously mentioned operation. If it is not zero, a transfer is made to the step 205 and the same operations as mentioned previously are performed at the steps 205 to 209, thereby making a return to the step 204.

If it is zero, the exposure operation is completed.

Then, when the second light quantity controller comprises a fast optical attenuator, if the average light quantity value P·β determined at the step 201 is a value which is based on the initial attenuation rate of the fast optical attenuator, at the step 208, the attenuation rate γn of the fast optical attenuator at the time of generation of the pulse light to be generated next is determined in accordance with the following equation (22). Here, it is assumed that P represents the average exposure energy of the pulse light generated from the pulsed laser source 10.

$$\gamma m = \frac{P \cdot \beta + Di}{P \cdot \beta} \quad (22)$$

Thus, at the next step 209, the attenuation rate of the fast optical attenuator is set to γn so that the same operations as mentioned previously are repeatedly performed at the steps 204 to 209 until the value n of the pulse counter is reduced to zero.

What is claimed is:

1. An exposure control apparatus for controlling the amount of exposure of a first body to pulse energy wherein said pulse energy, accompanied by energy variation within a predetermined range per each emission, is applied a plurality of times to said first body through a second body, and a pattern formed on said second body is transcribed onto said first body sensitive to said pulse energy by the plurality of times of the application of said pulse energy to said first body, said exposure control apparatus comprising:

arithmetic means for estimating the number of pulses necessary for the exposure base don the range of energy variation between the emission pulse energies each time said pulses are applied and the allowable accuracy of control of the amount of exposure of said first body to said pulse energy based on the desired total exposure, and for estimating the object value of the integrated light quantity to be supplied to said first body every time a pulse is applied to said first body based on the response to the number of pulses and the desired total exposure;

energy quantity measuring means for measuring the actual integrated light quantity obtained by the pulse energy previously applied to said first body; and energy quantity adjusting means for adjusting the amount of energy for the next pulse based on the difference between said object value of the integrated light quantity to be attained in response to the application of said next pulse and the previous actual value of integrated light quantity.

2. An exposure control apparatus as set forth in claim 1, wherein said energy quantity adjusting means is provided with a pair of grid members having a transmission portion for transmitting said pulse energy and a shading portion for shading said pulse energy, both portions being arranged with respect to each other with a prescribed arranging pitch in the form of stripes, and at least one of said pair of grid members is moved relatively to the other in the arranging pitch direction corresponding to the difference between said actual value and said object value.

3. An exposure control apparatus as set forth in claim 1, wherein said pulse energy is coherent pulse energy, and said energy quantity adjusting means is provided with an etalon element including a pair of transmission type plates arranged in parallel with a predetermined distance therebetween corresponding to the wavelength of said pulse energy, and the angle of said pair of transmission type plates is made variable with respect to the axial line transmitted by said pulse energy corresponding to the difference between said actual value and said object value.

4. An exposure control apparatus as set forth in claim 1, wherein said pulse energy is coherent pulse energy, and said energy quantity adjusting means is provided with a pair of transmission type diffraction gratings in parallel with each other having parallel and linear concave/convex portions formed in predetermined arranging pitch corresponding to the wavelength of said pulse energy, and at least one of said pair of transmission type diffraction gratings are transmitted by said pulse energy, and at least one of said pair of transmission type diffraction gratings is moved relatively to the other in the arranging pitch direction corresponding to the difference between said actual value and said object value.

5. An exposure control apparatus for controlling the amount of exposure of a first body to coherent pulse light wherein said coherent pulse light, accompanied by light quantity variation within a predetermined range per each emission, is applied a plurality of times to said first body through a second body, and an interference pattern formed on said first body or said second body by the illumination of said pulse light is displaced each time per the illumination of said pulse light and a required smoothing of the intensity of illumination is performed, and the pattern formed on said second body by the plurality of times of illumination of said pulse light is transcribed onto said first body sensitive to light, said exposure control apparatus comprising:

first arithmetic means for predetermining the average light quantity value of each pulse light with the pulse number based on the pulse number necessary for the required smoothing of the intensity of illumination and the predetermined value in response to the aimed proper exposure quantity;

second arithmetic means for determining the object value of the integrated light quantity to be supplied to said first body per each pulse with the necessary pulse number when said pulse light is illuminated under the average light quantity value;

light quantity measuring means for measuring the actual, value of integrated energy quantity supplied to said first body;

third arithmetic means for calculating the difference between said actual integrated energy quantity obtained by the pulse light previously illuminated and the object value of said integrated energy quantity; and light quantity adjusting means for adjusting the light quantity of the next pulse light to be illuminated so that it is corrected from the average light quantity value by a value corresponding to the calculated difference.

6. An exposure control apparatus as set forth in claim 5, wherein said light quantity adjusting means is provided with a pair of optical grid members having a transmission portion for transmitting said pulse light and a shading portion for shading said pulse light, both portions being arranged with respect to each other with a prescribed arranging pitch in the form of stripes, and at least one of said pair of optical grid members is moved relative to the other in the arranging pitch direction corresponding to the difference between said actual measured value and said object value.

7. An exposure control apparatus as set forth in claim 5, wherein said light quantity adjusting means is provided with an etalon element including a pair of transmission type plates arranged in parallel with a predetermined distance therebetween corresponding to the wavelength of said pulse light, and the angle of said pair of transmission type plates is made variable with respect to the axial line transmitted by said pulse light corresponding to the difference between said actual value and said object value.

8. An exposure control apparatus as set forth in claim 5, wherein said light quantity adjusting means is provided with a pair of transmission type diffraction gratings in parallel with each other having parallel and linear concave/convex portions formed in predetermined arranging pitch corresponding to the wavelength of said pulse light, and said pair of transmission type diffraction gratings are transmitted by said pulse light, and at least one of said pair of transmission type diffraction gratings is moved relatively to the other in the arranging pitch direction corresponding to the difference between said actual value and said object value.

9. An exposure apparatus wherein a pattern formed on a second body, is transcribed onto a first body by illumination of pulse light onto said first body sensitive to light a plurality of times at predetermined exposure quantity, said exposure apparatus comprising:

a light source for emitting coherent pulse light a plurality of times, said pulse light being accompanied by light quantity variation within a predetermined range per each emission;

an illumination optical system for illuminating said pulse light to the first body through said pattern of said second body;

smoothing means for displacing an interference pattern formed on said first body or said second body by the illumination of said pulse light per each illumination of said pulse light, and for performing the required smoothing of the intensity of illumination;

first arithmetic means for predetermining the average light quantity value of each pulse light with the pulse number based on the pulse number necessary for the required smoothing of the intensity of illumination and the predetermined value in response to the aimed proper exposure quantity;

second arithmetic means for determining the object value of the integrated light quantity to be supplied to said first body per each pulse with the necessary pulse number when said pulse light is illuminated under the average light quantity value;

light quantity measuring means for measuring the actual value of integrated energy quantity supplied to said first body;

third arithmetic means for calculating the difference between said actual integrated energy quantity obtained by the pulse light previously illuminated and the object value of said integrated energy quantity; and light quantity adjusting means for adjusting the light quantity of the next pulse light to be illuminated so that it is corrected from the average light quantity value by a value corresponding to the calculated difference.

10. An exposure apparatus as set forth in claim 9, wherein said light quantity adjusting means is installed between said pulsed light source and said smoothing means.

11. An exposure apparatus as set forth in claim 9, wherein said light quantity adjusting means is provided with a pair of grid members having a transmission portion for transmitting said pulse light and a shading portion for shading said pulse light, both portions being arranged with respect to each other with a prescribed arranging pitch in the form of stripes, and at least one of said pair of grid members is moved relatively to the other in the arranging pitch direction corresponding to the difference between said actual value and said object value.

12. An exposure apparatus as set forth in claim 9, wherein said light quantity adjusting means is provided with an etalon element including a pair of transmission type plates arranged in parallel with a predetermined distance therebetween corresponding to the wavelength of said pulse light, and the angle of said pair of transmission type plates is made variable with respect to the axial line transmitted by said pulse light corresponding to the difference between said actual value and said object value.

13. An exposure apparatus as set forth in claim 9, wherein said light quantity adjusting means is provided with a pair of transmission type diffraction gratings in parallel with each other having parallel and linear concave/convex portions formed in predetermined arranging pitch corresponding to the wavelength of said pulse light, and said pair of transmission type diffraction gratings are transmitted by said pulse light, and at least one of said pair of transmission type diffraction gratings is moved relatively to the other in the arranging pitch direction corresponding to the difference between said actual value and said object value.

14. An exposure apparatus wherein a pattern formed on a second body, is transcribed onto a first body by illumination of pulse energy onto said first body sensitive to said pulse energy a plurality of times at predetermined exposure quantity, said exposure apparatus comprising:

a pulse energy emitting source for emitting pulse energy a plurality of times, said pulse energy being accompanied by energy variation within a predetermined range per each emission;

an illumination system for applying said pulse energy to said first body through said second body;

arithmetic means for estimating the number of pulses necessary for the exposure based on the range of energy variation between the emission pulse energies each time said pulses are applied and the allowable accuracy of control of the amount of exposure of said first body to said pulse energy based on the desired total exposure, and for estimating the object value of the integrated light quantity to be supplied to said first body every time a pulse is applied to said first body based on the response to the number of pulses and the desired total exposure;

energy quantity measuring means for measuring the actual integrated light quantity obtained by the pulse energy previously applied to said first body; and energy quantity adjusting means for adjusting the amount of energy for the next pulse based on the difference between said object value of the integrated light quantity to be attained in response to the application of said next pulse and the previous actual value of integrated light quantity.

15. An exposure apparatus as set forth in claim 14, wherein said energy quantity adjusting means is provided with a pair of grid member shaving a transmission portion for transmitting said pulse energy and a shading portion of shading said pulse energy, both portions being arranged with respect to each other with a prescribed arranging pitch in the form of stripes and at least one of said pair of grid members is moved relatively to the other in the arranging pitch direction corresponding to the difference between said actual value and said object value.

16. An exposure apparatus as set forth in claim 14, wherein said pulse energy emitting source emits coherent pulse energy, and said energy quantity adjusting means is provided with an etalon element including a pair of transmission type plates arranged in parallel with a predetermined distance therebetween corresponding to the wavelength of said pulse energy, and the angle of said pair of transmission type plates is made variable with respect to the axial line transmitted by said pulse energy corresponding to the difference between said actual value and said object value.

17. An exposure apparatus as set forth in claim 14, wherein said pulse energy emitting source emits coherent pulse energy, and said energy quantity adjusting means is provided with a pair of transmission type diffraction gratings in parallel with each other having parallel and linear concave/convex portions formed in predetermined arranging pitch corresponding to the wavelength of said pulse energy, and said pair of transmission type diffraction gratings are transmitted by said pulse energy, and at least one of said pair of transmission type diffraction gratings is moved relatively to the other in the arranging pitch direction corresponding to the difference between said actual value and said object value.

18. An exposure control apparatus for controlling the amount of exposure of a first body to pulse energy wherein said pulse energy, accompanied by energy variation within a predetermined range per each emission, is applied a plurality of times to said first body through a second body, and a pattern formed on said second body is transcribed onto said first body sensitive to said pulse energy by the plurality of times of the application of said pulse energy to said first body, said exposure control apparatus comprising:

first adjusting means for uniformly adjusting the amount of each said pulse energy applied to said first body with a predetermined degree of adjustment;

arithmetic means for estimating the number of pulses necessary for the exposure based on the range of energy variation between the emission pulse energies each time said pulses are applied and the allowable accuracy of control of the amount of exposure of said first body to said pulse energy based on the desired total exposure, and for estimating the object value of the integrated input quantity to be supplied to said first body every time a pulse is applied to said first body based on the response to the number of pulses and the desired total exposure;

energy quantity measuring means for measuring the actual integrated light quantity obtained by the pulse energy previously applied to said first body; and second adjusting means for adjusting the amount of energy for the next pulse to correspond to the difference between said object value of the integrated light quantity to be attained in response to the application of said next pulse and the previous actual value of integrated light quantity.

19. An exposure control apparatus according to claim 18, further comprising a light source for emitting said pulse energy, and wherein said second adjusting means controls a predetermined oscillation condition of said light source each time said pulse energy is applied to adjust the amount of said pulse energy.

20. An exposure control apparatus according to claim 18, wherein said first adjusting means changes the degree of adjustment of the amount of said pulse energy continuously or in steps only when the exposure condition of said second body is changed.

* * * * *